(12) United States Patent
Shigeta et al.

(10) Patent No.: US 7,310,001 B2
(45) Date of Patent: Dec. 18, 2007

(54) CURRENT SENSING METHOD AND CURRENT SENSING DEVICE, POWER CONVERSION DEVICE USING THIS CURRENT SENSING DEVICE, AND VEHICLE USING THIS POWER CONVERSION DEVICE

(75) Inventors: Satoru Shigeta, Hitachinaka (JP); Shinichi Fujino, Mito (JP); Keita Hashimoto, Hitachinaka (JP); Sadashi Seto, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/206,861

(22) Filed: Aug. 19, 2005

(65) Prior Publication Data

US 2006/0103409 A1   May 18, 2006

(30) Foreign Application Priority Data

Nov. 4, 2004  (JP) .............................. 2004-320803

(51) Int. Cl.
*G01R 31/26* (2006.01)
(52) U.S. Cl. ..................................... 324/769
(58) Field of Classification Search ................ 324/760, 324/765, 769; 323/316; 361/103
See application file for complete search history.

(56) References Cited

U.S. PATENT DOCUMENTS 3,609,549 A * 9/1971 Hausler et al. ............. 324/700
4,553,084 A * 11/1985 Wrathall .................... 323/316
5,079,608 A * 1/1992 Wodarczyk et al. ........ 257/355
5,304,802 A * 4/1994 Kumagai .................... 257/328
5,635,823 A * 6/1997 Murakami et al. .......... 323/277
5,652,382 A * 7/1997 Nakagawa et al. ....... 73/335.02
6,300,818 B1 * 10/2001 Mao .......................... 327/513
6,545,515 B2 * 4/2003 Takahashi et al. .......... 327/110

FOREIGN PATENT DOCUMENTS

| JP | 63 234166 A | 9/1988 |
| JP | 2000 338146 A | 12/2000 |
| JP | 2003-061392 | 2/2003 |

OTHER PUBLICATIONS

European Search Report for EP 05 01 7864.9 dated Mar. 2, 2006.

* cited by examiner

*Primary Examiner*—Ha Tran Nguyen
*Assistant Examiner*—Arleen M. Vazquez
(74) *Attorney, Agent, or Firm*—Crowell & Moring LLP

(57) ABSTRACT

A current sensing device for sensing current flowing through a MOSFET has a voltage divider circuit composed of a series circuit of a first resistor and a second resistor having different resistance temperature coefficients, with a voltage division ratio designed to change depending on temperature. The sensing device is connected between a source and a drain of said MOSFET. A sensing circuit takes out the source-to-drain voltage divided with the voltage divider to sense the current flowing through the MOSFET.

2 Claims, 7 Drawing Sheets

GRAPH, TEMPERATURE VS. RATIO OF SENSED VOLTAGE TO ON-VOLTAGE AT 25°C, OBTAINED BY SECOND EMBODIMENT

CURRENT SENSING METHOD AND CURRENT SENSING DEVICE, POWER CONVERSION DEVICE USING THIS CURRENT SENSING DEVICE, AND VEHICLE USING THIS POWER CONVERSION DEVICE

CLAIM OF PRIORITY

The present application claims priority from Japanese application serial no. 2004-320803, filed on Nov. 4, 2004, the contents of which are hereby incorporated by references into this application.

BACKGROUND OF THE INVENTION

The present invention relates to a method of sensing current flowing through a MOSFET and, more particularly, to a current sensing method and device or the like suitable for a power conversion device using MOSFETs as switching elements.

In power conversion devices such as a DC/DC converter and a three-phase inverter, typically, currents flowing through switching elements are sensed and results of this sensing are reflected in control, and, for this purpose, current sensors of a magnetic field sensing type utilizing Hall elements have been used conventionally.

Figure 9:
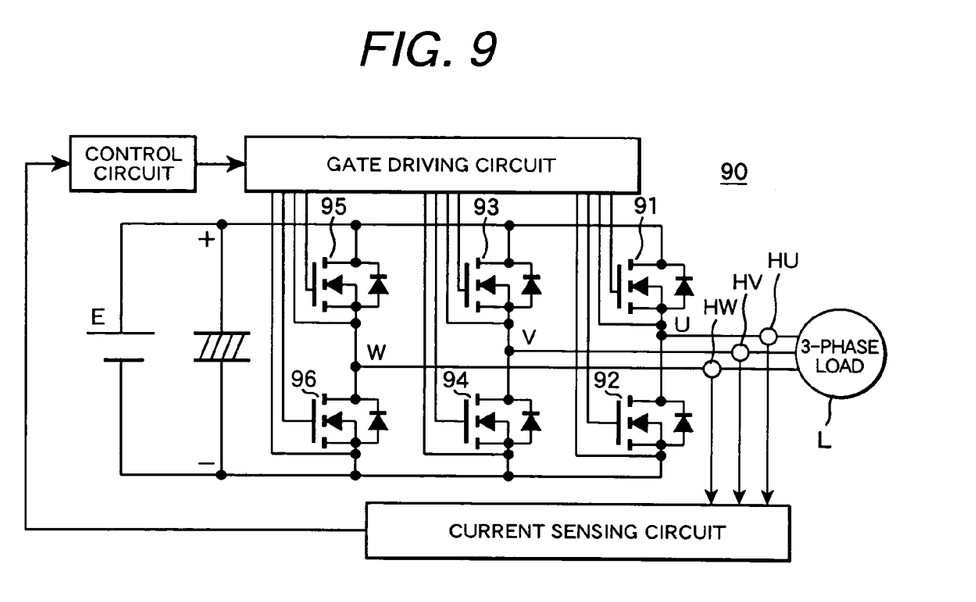
FIG. 9 is a circuit block diagram showing an example of a power conversion device according to prior art, using current sensors of a magnetic field sensing type.

FIG. 9 shows a three-phase inverter device using MOSFETs as switching elements as an example of a power conversion device. The three-phase inverter is equipped with the current sensors of the magnetic field sensing type. As shown, this device has a main circuit 90 of the three-phase inverter to which a DC +/− voltage is supplied from an electrical source E such as a battery, and which supplies three-phase load L with three-phase AC power.

The main circuit 90 is comprised of a MOSFET 91 of a U-phase upper-arm, a MOSFET 92 of a U-phase lower-arm, a MOSFET 93 of a V-phase upper-arm, a MOSFET 94 of a V-phase lower-arm, a MOSFET 96 of a W-phase upper-arm, and a MOSFET 93 of a W-phase lower-arm.

These six MOSFETs 91 to 96 are each on/off controlled by switching signals that are fed from a gate driving circuit and work to convert the DC +/− voltage being supplied from the electrical source E into three-phase AC power, which has a predetermined voltage less than the voltage of the electrical source E and a predetermined frequency. The three-phase AC power is supplied to three-phase load L such as, for example, an induction motor.

Magnetic field type current sensors HU, HV, and HW using Hall elements are located on output lines of U, V and W phases of the main circuit 90. Current in each phase supplied from the main circuit 90 to the load L is sensed by the corresponding one of the current sensors. A sensed value of the current is input to a current sensing circuit, and sensing results from the current sensing circuit are input to a control circuit. Thereby, feedback control of the current by the control circuit can be accomplished.

By the way, the requirements for this current sensor include small size, low loss, and low cost as well as high accuracy; however, in general, a magnetic field type current sensor using a Hall element is comparatively large in size and costly.

Meanwhile, a current sensor using a shunt resistor has also been used conventionally, but, in this type of current sensor, loss proportional to current occurs and, consequently, the greater the current sensed, the loss will be a serious problem.

Figure 10:
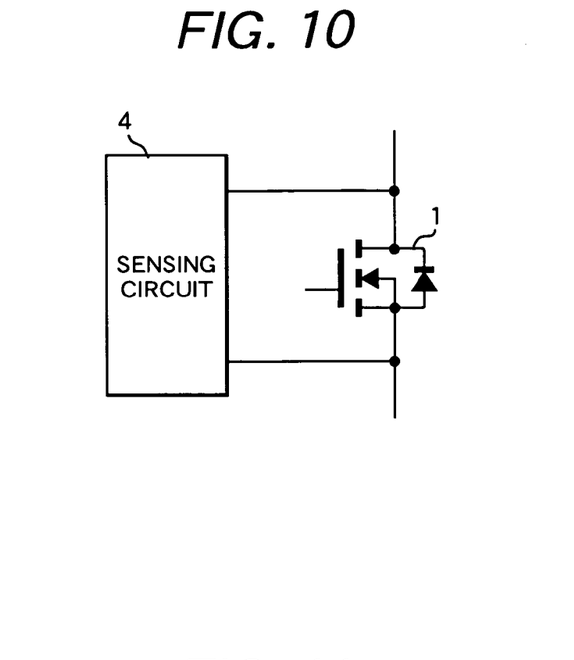
FIG. 10 is a circuit block diagram showing an example of a MOSFET current sensing method according to prior art.

Then, a current sensing method which is illustrated in FIG. 10 has been proposed, wherein a sensing circuit 4 is connected to the source and emitter of a MOSFET 10 to take input of on-voltage of the MOSFET 10. The sensing circuit 4 converts the on-voltage into a current value, thus sensing a current flowing through the MOSFET 10.

Here, the on-voltage is a voltage developing between the source and drain of the MOSFET when the MOSFET is turned on by a gate signal and allowing current to flow through the MOSFET.

However, the on-voltage of the MOSFET strongly depends on temperature and changes in proportion to the square of an absolute temperature substantially. Therefore, the sensed voltage greatly changes with temperature change even if a constant current flows through the MOSFET.

Figure 11:
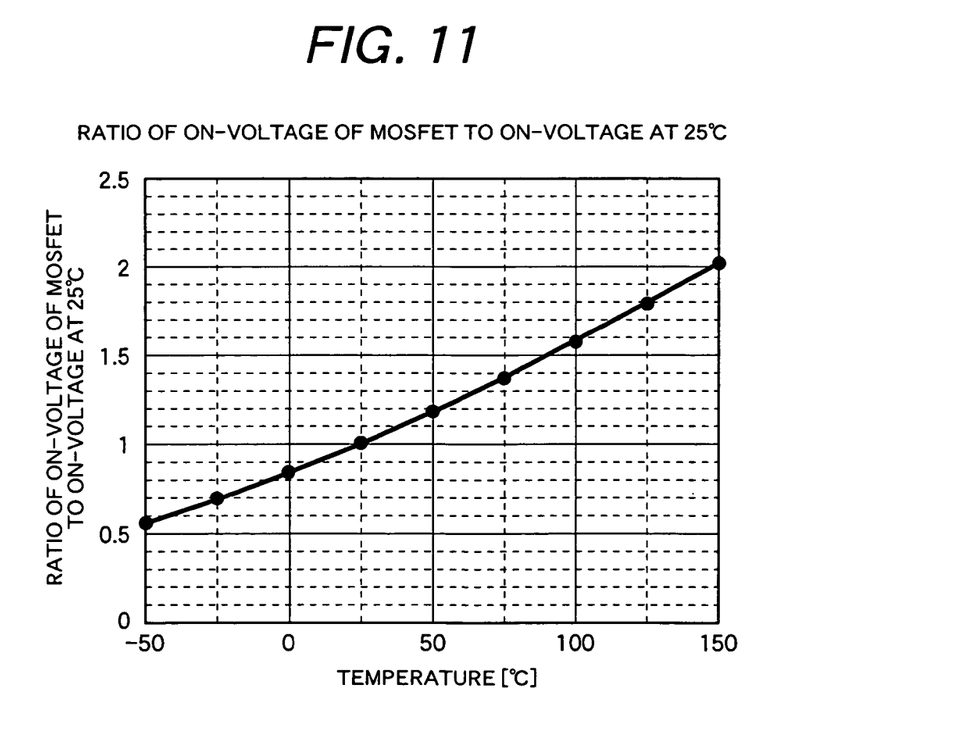
FIG. 11 is a characteristic graph showing an example of a sensed voltage vs. temperature characteristic according to prior art.

FIG. 11 shows a graph of the varying ratio of on-voltage that the sensing circuit 4 takes at a constant current to the on-voltage when the junction temperature of the MOSFET 10 is 25° C., which is assumed to be 1. From this graph, it is seen that the on-voltage of the MOSFET strongly depends on temperature.

For this reason, in the case of the current sensing method illustrated in FIG. 10, thermal compensation is needed for the current sensor. For this purpose, a technique in which the MOSFET temperature is sensed and input to a microcomputer in the sensing circuit and the microcomputer computes a thermally compensated current value has so far been known (e.g., Japanese Patent Application Laid-Open No. 2003-61392).

Figure 12:
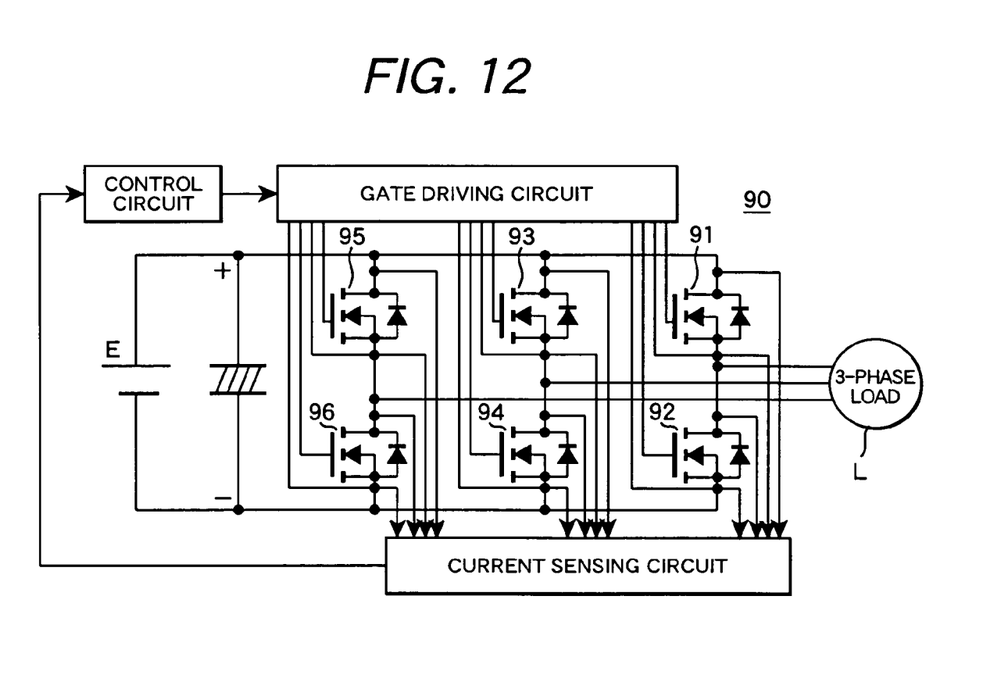
FIG. 12 is a circuit diagram showing an example of an inverter device as a power conversion device to which the current sensing method according to prior art is applied.

FIG. 12 shows an example of an inverter device as a power conversion device to which this current sensing method is applied. This inverter dispenses with the magnetic field type current sensors HU, HV, and HW using the Hall elements, which exist in the inverter device shown in FIG. 9, and is arranged such that on-voltages from the sources and drains of the six MOSFETs 91 to 96 are input to the current sensing circuit.

SUMMARY OF THE INVENTION

The above prior art requires the installation of an additional thermal sensor and the computation by the microcomputer for current sensing, as a results, remains to be downsized and reduced costs. In other words, the prior art adds the cost for the thermal sensor installation and increases the computational load on the microcomputer because of high-speed computation requirement for high-speed current sensing, thus posing a problem in cost reduction and downsizing.

An object of the present invention is to provide, at low cost, a current sensing method and device allowing for accurate sensing of current through a MOSFET.

Another object of the present invention is to provide a power conversion device and a vehicle employing a MOSFET current sensing device.

To achieve the above objects, the present invention has been contemplated to enable getting thermally compensated on-voltage from a MOSFET. For this purpose, a current sensing method for sensing current flowing through a MOSFET has been developed to divide a source-to-drain voltage of the MOSFET by a voltage divider circuit consisting of a series circuit of a first resistor and a second resistor and with a voltage division ratio that changes depending on temperature, take out a divided voltage, convert the voltage into a current, thereby sensing the current flowing through the MOSFET.

In the above current sensing method, at least a part of resistance of the first resistor may be on-resistance of a MOSFET mirrored to the MOSFET to be current sensed and at least a part of the first resistor may be made by a thermistor with a positive resistance temperature coefficient.

Also in the above current sensing method, the second resistor may be a resistor with a negative resistance temperature coefficient and at least a part of the second resistor may be made by a thermistor with a negative resistance temperature coefficient.

Also in the above current sensing method, when an on-resistance value of the MOSFET to be current sensed is denoted by Ron, a resistance value of the first resistor by R1, and a resistance value of the second resistor by R2, a value of expression Ron*R2/(R1+R2) may either fall within 5% for a temperature range of not more than 50° C. or fall within 25% for a temperature range of above 50° C. to 200° C.

Furthermore, in the above current sensing method, the series circuit may include a MOSFET other than the MOSFET to be current sensed, wherein this other MOSFET may be on/off controlled at the same timing as the MOSFET to be current sensed and on-resistance of this other MOSFET may form at least a part of resistance of the first resistor.

Then, a current sensing device for sensing current flowing through a MOSFET is provided and the above objects are achieved by the current sensing device in which a voltage divider circuit consisting of a series circuit of a first resistor and a second resistor having different resistance temperature coefficients and with a voltage division ratio designed to change depending on temperature is provided between a source and a drain of the MOSFET and the current flowing through the MOSFET is sensed by converting a voltage taken out by the voltage divider circuit into a current.

In the above current sensing device, at least a part of the first resistor is constituted by on-resistance of a MOSFET mirrored to the MOSFET to be current sensed and at least a part of the first resistor may be constituted by a thermistor with a positive resistance temperature coefficient.

Also in the above current sensing device, the second resistor may be constituted by a resistor with a negative resistance temperature coefficient and at least a part of the second resistor may be constituted by a thermistor with a negative resistance temperature coefficient.

Also in the above current sensing device, when an on-resistance value of the MOSFET to be current sensed is denoted by Ron, a resistance value of the first resistor by R1, and a resistance value of the second resistor by R2, a value of expression Ron*R2/(R1+R2) may either fall within 5% for a temperature range of not more than 50° C. or fall within 25% for a temperature range of above 50° C. to 200° C.

Furthermore, in the above current sensing device, the series circuit may include a MOSFET other than the MOSFET to be current sensed, wherein this other MOSFET may be on/off controlled at the same timing as the MOSFET to be current sensed and on-resistance of this other MOSFET may form at least a part of resistance of the first resistor.

Then, the above objects are also achieved by a power conversion device that includes any current sensing device described above and performs current feedback control, based on current sensed by the current sensing device, wherein temperature may be detected by comparison between a voltage appearing across the first resistor and a voltage appearing across the second resistor to enable thermal protection.

The above objects are also achieved by a vehicle employing a power conversion device that includes any current sensing device described above and performs current feedback control, based on current sensed by the current sensing device.

According to the present invention, it is possible to get on-voltage that has already been thermally compensated at the stage of inputting results of sensing. Therefore, it is possible to take full advantage of small size and low loss features of the current sensing by on-voltage sensing.

In consequence, according to the present invention, a power conversion device with high accuracy of control can be provided at low cost, which can contribute to enhance the performance of a vehicle employing the power conversion device.

DESCRIPTION OF THE PREFERRED EMBODIMENTS

Figure 1:
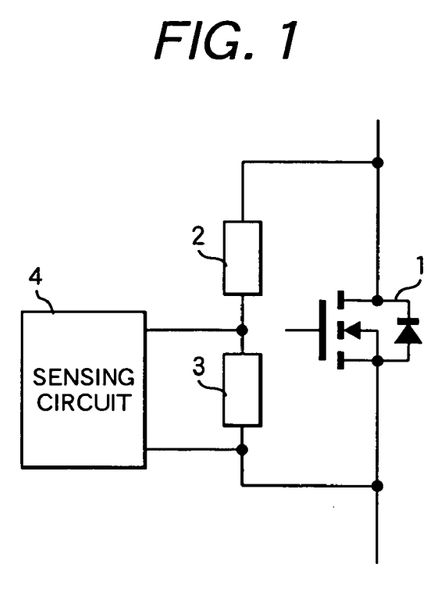
FIG. 1 is a circuit block diagram showing a first embodiment of the current sensing method according to the present invention.

The present invention will now be described through its embodiments shown in the drawings. Primarily, in the current sensing method according to the present invention, as is shown in FIG. 1, a series circuit of a first resistor 2 and a second resistor 3 having different resistance temperature coefficients is connected in parallel with a MOSFET 1 between a source and a drain of the MOSFET 1. A voltage divider circuit with a voltage division ratio, which changes depending on temperature, is formed by this series circuit. A voltage appearing across the second resistor 3 is input to a sensing circuit 4. Thereby, a voltage developing between the source and drain of the MOSFET 1, namely, on-voltage divided by the first resistor 1 and the second resistor 3, is input to the sensing circuit 4, and converted into a current value by the sensing circuit 4, and, consequently, the current is sensed.

Here, firstly, the first resistor 2 may be composed of a single resistor or plural resistors, wherein the resistor may be formed by a semiconductor element or semiconductor elements connected in series or in parallel.

Likewise, the second resistor 3 may be composed of a single resistor or plural resistors, wherein the resistor may be formed by a semiconductor element or semiconductor elements connected in series or in parallel.

The present invention is characterized in that the resistance temperature coefficient of the first resistor 2 is made different from that of the second resistor 3, and the voltage division ratio of the voltage divider circuit has been designed so as to become greater as temperature rises.

Here, the sensing circuit 4, which is mainly comprised of an amplifier, works to transfer a sensed voltage as current sensor output to a host control unit.

As described already with FIG. 11, the on-voltage of the MOSFET strongly depends on temperature and, with an increase in temperature, the on-voltage increases even at a constant current. In this regard, in an embodiment shown in FIG. 1, as described above, the resistance temperature coefficient of the first resistor 2 is made different from that of the second resistor 3, and the voltage division ratio of the voltage divider circuit becomes greater as temperature rises. In consequence, the temperature dependency of the on-voltage by temperature rise is compensated with changes in the voltage division ratio, and the on-voltage in which the temperature dependency has been compensated can be sensed by the sensing circuit 4.

Therefore, according to this embodiment of FIG. 1, only by converting the voltage input to the sensing circuit 4 directly into a current, the current flowing through the MOSFET 1 can be sensed without computation by a microcomputer or the like for thermal compensation of a current value.

To make the resistance temperature coefficient of the first resistor 2 different from that of the second resistor 3, it is preferable to form at least a part of the first resistor 2 by a thermistor with a positive resistance temperature coefficient. It may also be preferable to make the second resistor 3 having a negative resistance temperature coefficient. Furthermore, it may also be preferable to form at least a part of the second resistor 3 by a thermistor with a negative resistance temperature coefficient.

By the way, because sensing the on-voltage of the MOSFET in this way is performed only when the MOSFET remains "turned-on" by control and current is flowing through it, a sampling or another is usually needed.

Figure 2:
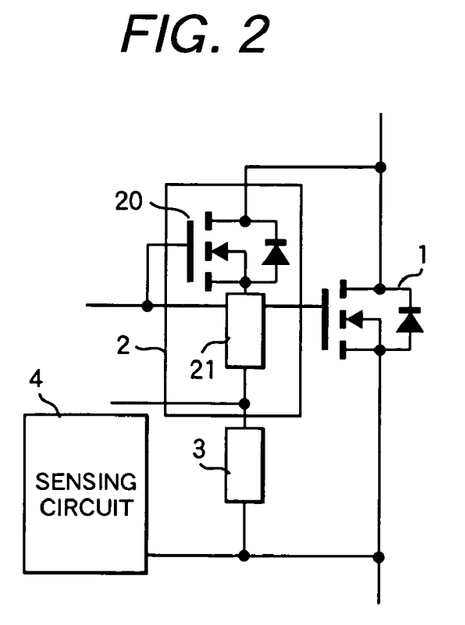
FIG. 2 is a circuit block diagram showing a second embodiment of the current sensing method according to the present invention.

In such case, as is shown in FIG. 2, it is preferable to provide another MOSFET 20 that is driven by the same gate signal as the MOSFET 1, which is also a feature of the present invention. Here, on-resistance of the MOSFET 20 becomes a part of the first resistor 2, as shown.

As the MOSFET 20, a mirror MOSFET existing on the same chip as the MOSFET 1 may be used or some other MOSFET may also be used.

The following will describe embodiments of the present invention by way of some examples.

EXAMPLE 1

Figure 3:
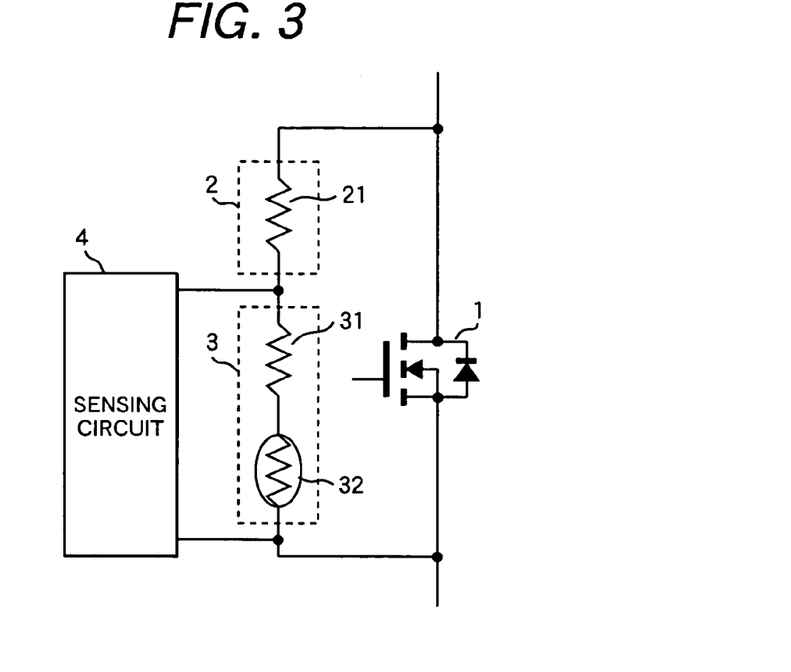
FIG. 3 is a circuit block diagram showing a third embodiment of the current sensing method according to the present invention.

FIG. 3 shows one example of the present invention where a resistor 21 is employed as the first resistor 2, and a series circuit of a resistor 31 and a thermistor 32 is employed as the second resistor 3, wherein the thermistor 32 with a negative temperature coefficient is employed.

Here, firstly, as the resistor 21, a chip fixed resistor manufactured by KOA Corporation (type designation RK73H2BTTD1501F, a resistance value of 1.5 K$\Omega$) was used. Secondly, as the resistor 31, a chip fixed resistor manufactured by KOA Corporation (type designation RK73H2BTTD1201F, a resistance value of 1.2 K$\Omega$) was used. As the thermistor 32 with a negative temperature coefficient, a chip thermistor manufactured by Shibaura Electronics Co., Ltd. (type designation KG3T-43) was used.

Figure 4:
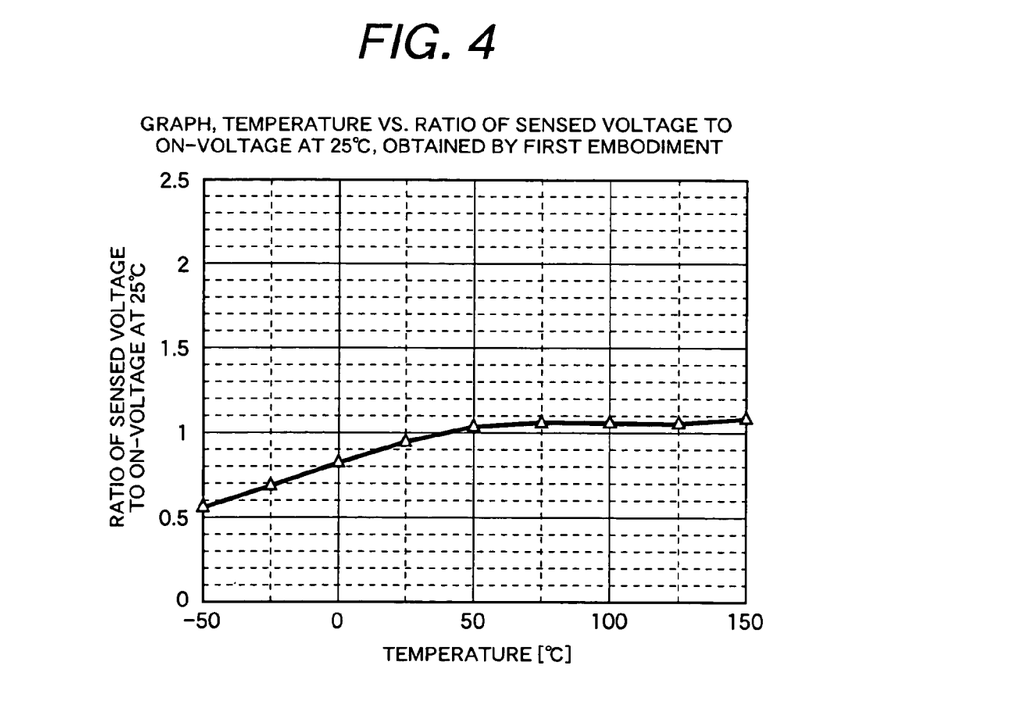
FIG. 4 is a characteristic graph showing an example of a sensed voltage vs. temperature characteristic according to one embodiment of the present invention.

FIG. 4 shows a characteristic graph of temperature vs. the varying ratio of sensed voltage to the on-voltage when the junction temperature of the MOSFET 1 is 25° C., wherein the on-voltage is assumed to be 1, in this example. As is apparent from this graph of FIG. 4, according to this embodiment example 1, it turns out that such result of current sensing is achieved that sensed voltage varies within 5% with temperature change in a range from 50° C. to 150° C. Thus, it is possible to provide a current sensor exhibiting a superior temperature characteristic when applied to a power conversion device with an operating temperature range corresponding to the above temperature range, i.e., 50-150° C.

EXAMPLE 2

Embodiment example 2 is an example where different resistance values are used from those for example 1 in the same circuitry as shown in FIG. 3. Firstly, as the resistor 21, a chip fixed resistor manufactured by KOA Corporation (type designation RK73H2BTTD2002F, a resistance value of 20.0 KQ) was used. Secondly, as the resistor 31, a chip fixed resistor manufactured by KOA Corporation (type designation RK73H2BTTD1002F, a resistance value of 10.0 K$\Omega$) was used. As the thermistor 32 with a negative temperature coefficient, a chip thermistor manufactured by Shibaura Electronics Co., Ltd. (type designation KG3T-43) was used.

Figure 5:
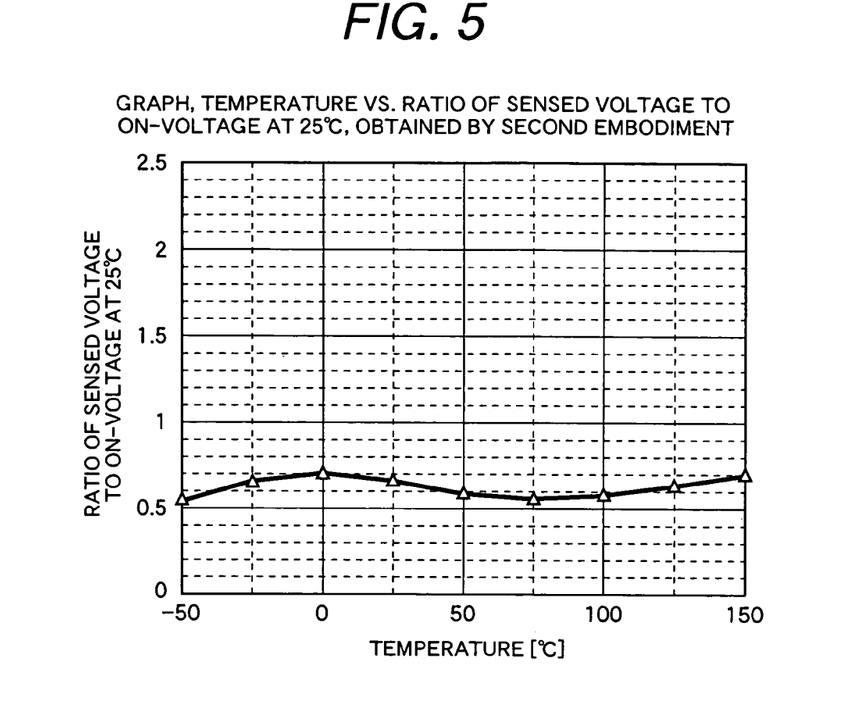
FIG. 5 is a characteristic graph showing an example of a sensed voltage vs. temperature characteristic according to another embodiment of the present invention.

FIG. 5 shows a graph of temperature vs. the varying ratio of sensed voltage to the on-voltage in this example 2, wherein the on-voltage when the junction temperature of the MOSFET 1 is 25° C. is again assumed to be 1. As is apparent from this graph of FIG. 5, a variation within 25% in the sensed voltage with temperature change in a range from −50° C. to 150° C. is achieved in this example 2.

Next, another embodiment of the present invention will be described. For example, in embodiment example 2, the ratio between a voltage across the resistor 31 and a voltage across the thermistor 32 with a negative temperature coefficient corresponds to the ratio between the resistance value of the resistor 31 and the resistance value of the thermistor 32, because both are connected in series.

From the fact that these elements have different temperature coefficients, thus having a specific resistance ratio at a given temperature, the temperatures of the resistors 1 and 2 can be calculated from the ratio between the resistance value of the resistor 31 and the resistance value of the thermistor 32, namely, the voltage division ratio.

Then, here, the sensing circuit takes the inputs of a voltage across the resistor 31 and a voltage across the thermistor 32 with a negative temperature coefficient, and calculates the temperatures of the resistors 1 and 2 from the ratio between these voltages, so that this adapted method can be used for, for example, thermal protection control of a power conversion device.

Figure 6:
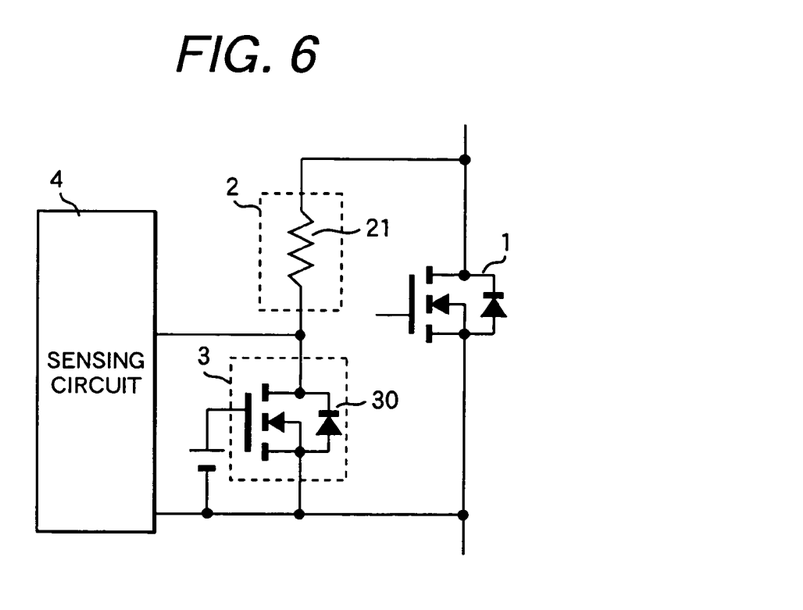
FIG. 6 is a circuit block diagram showing a fourth embodiment of the current sensing method according to the present invention.

Next, FIG. 6 shows a further embodiment of the present invention characterized in that a MOSFET 30 is employed to form a part of the second resistor 3, as shown. This MOSFET 30 is placed in an active operating state by applying a constant voltage between its gate and source, as shown.

In consequence, as temperature rises, the gate threshold voltage of the MOSFET 30 decreases, the active operating region changes, and the on-voltage falls. In other words, this MOSFET 30 comes to operate as a resistor having a negative temperature coefficient.

Therefore, according to this embodiment as well, the temperature dependency of the on-voltage by temperature rise is compensated, and the on-voltage in which the temperature dependency has been compensated can be sensed by the sensing circuit 4. Only by converting the voltage input to the sensing circuit 4 directly into a current, the current flowing through the MOSFET 1 can be sensed without computation by a microcomputer or the like for thermal compensation of a current value.

Figure 7:
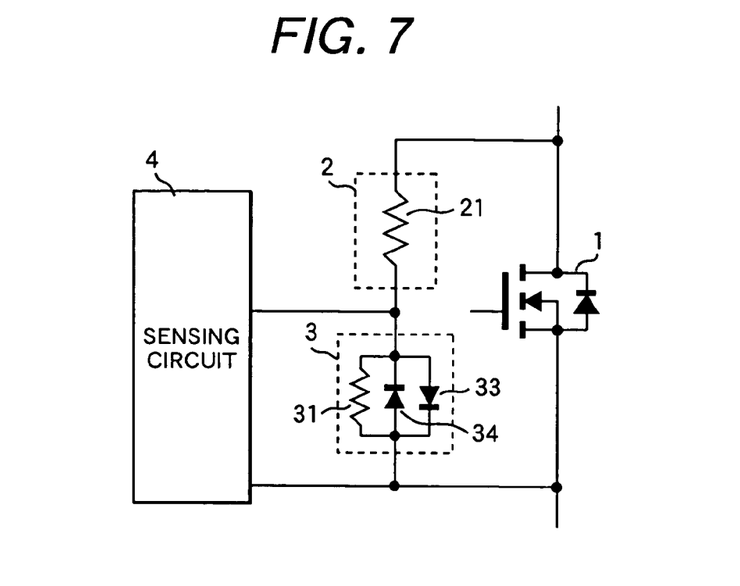
FIG. 7 is a circuit block diagram showing a fifth embodiment of the current sensing method according to the present invention.

Furthermore, FIG. 7 shows a still further embodiment of the present invention. This embodiment takes advantage of the fact that forward voltage drop of a diode has a negative temperature characteristic. Diodes are employed to form a part of the second resistor 3, as shown, wherein two diodes 33 and 34 have opposite polarity to enable sensing current flowing in both directions and are connected in parallel with the resistor 31.

Therefore, according to this embodiment of FIG. 7 as well, the temperature dependency of the on-voltage by temperature rise is compensated, and the on-voltage in which the temperature dependency has been compensated can be sensed by the sensing circuit 4. Only by converting the voltage input to the sensing circuit 4 directly into a current, the current flowing through the MOSFET 1 can be sensed without computation by a microcomputer or the like for thermal compensation of a current value.

While, in any case of the foregoing embodiments, circuitry including a single switching MOSFET has been discussed, a MOSFET switching element may be used singly, but in most cases, a suite of MOSFET switching elements are used in a power conversion device such as an inverter, as described already.

In this case, one of the circuits of the above embodiments may be used as the circuits of the MOSFETs 91 to 96 in the inverter device 90 described with FIG. 12, which forms an embodiment of the present invention.

By the way, power conversion devices using switching elements such as inverter devices are widely used in various segments of industry. In particular, an inverter device using MOSFETs as switching elements is often used in a vehicle such as an automobile in which a battery is mounted as an electrical source.

Figure 8:
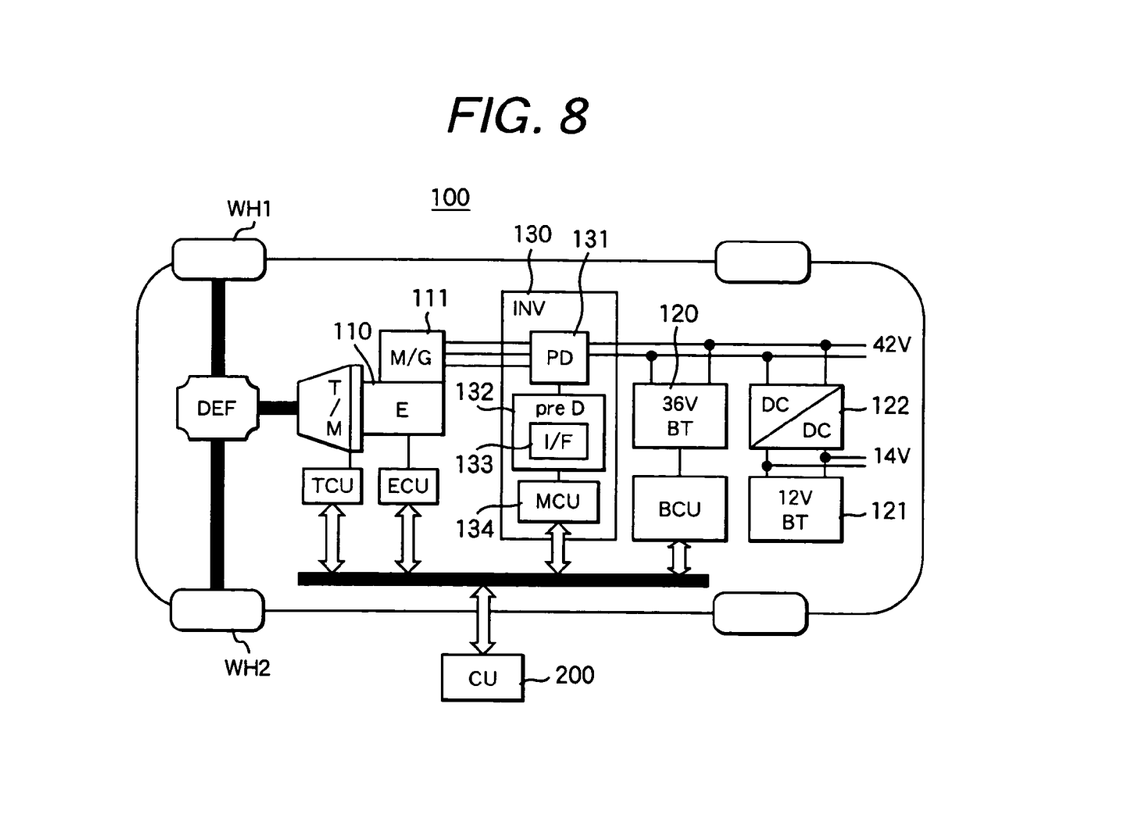
FIG. 8 is a schematic diagram showing an embodiment of a vehicle in which the current sensing device according to the present invention is mounted.

FIG. 8 shows an embodiment of an automobile 100 as an example of a vehicle involved in an embodiment of the present invention. This embodiment will be described below. This automobile 100 is powered by an engine 110 such as, for example, a gasoline type internal combustion engine. A motor generator (M/G) 111 is coupled to the engine 110 so that the M/G 111 operates as both a normal alternator and a starter.

During run of the vehicle, torque of the engine 110 is transferred via a transmission (T/M) and a differential gear device (DEF) to wheels WH1 and WH2.

When the engine 110 is running, the M/G 111 operates as the alternator (AC generator), as described above, to charge two secondary batteries, namely, a main battery 120 with a terminal voltage rated at 36 V and an auxiliary battery 121 with a terminal voltage rated at 12 V.

When the engine 110 starts up, AC power is supplied from the main battery 120 to the M/G 111 via an inverter 130, causing the M/G 111 to operate as the AC motor that applies a starting torque to the engine 110.

For M/G operation, an inverter device (INV) 130 is connected to the M/G 111. When the M/G 111 operates as the alternator, this INV 130 carries out forward conversion to convert AC output of the M/G 111 into DC output. The DC output is charged into the main battery 120 and the auxiliary battery 121.

When the M/G 111 operates as the AC motor, the INV 130 carries out reverse conversion to convert DC output of the main battery 120 into three-phase AC power. The three-phase AC power is supplied to the M/G 111 to generate a necessary torque to start the engine 110.

The auxiliary battery 121 is used for accessories such as electric lights etc because accessories for ordinary operate at 12 DCV. Thus, in order to charge the auxiliary battery, a DC/DC converter (DC/DC) 122 for 36 V/12 V specification is provided, and the auxiliary battery is connected via the DC/DC converter to the INV 130.

In the embodiment of FIG. 8, PD (power device: Inverter main circuit) 131 is used for the INV130, and it is composed of the circuit according to any of the above embodiments, that is, the circuit in which the first resistor 2 and the second resistor 3 are connected with the MOSFET 1.

The PD 131 is controlled by a microcomputer 134 via a driving circuit 132 and an interface 133 and the microcomputer 134 is further controlled by a host control unit (CU) 200 that exerts overall control of the automobile 100.

The M/G 111 may operate as not only the AC motor to start the engine, but also a drive source or an auxiliary drive source for driving the automobile.

As described above, according to an embodiment of the present invention, the current sensing method is capable of ensuring the sensed voltage at an accuracy level required for practical application, and compensating variations in the sensed voltage with temperature changes by hardware. By applying this current sensing method to current control, particularly in a power converter for automobile use, the power conversion device for automobile use can be provided with current sensors having the features of high accuracy, small size, low loss, and low cost.

What is claimed is:

1. A current sensing method, for sensing current flowing through a MOSFET, comprising the steps of:
    dividing a source-to-drain voltage of the MOSFET with a voltage divider circuit composed of a series circuit of a first resistor and a second resistor, wherein the voltage divider is connected with the MOSFET in parallel, and a voltage division ratio of the first resistor and the second resistor changes depending on temperature; and
    sensing the current flowing through the MOSFET from the source-to-drain voltage divided with the voltage divider,
    wherein when an on-resistance value of the MOSFET is denoted by Ron, a resistance value of the first resistor by R1, and a resistance value of said second resistor by R2, a value of expression Ron*R2/(R1+R2) either falls within 5% for a temperature range of not more than 50° C. or falls within 25% for a temperature range of above 50° C. to 200° C.

2. A current sensing device, for sensing current flowing through a MOSFET, comprising:

a voltage divider circuit composed of a series circuit of a first resistor and a second resistor having different resistance temperature coefficients, with a voltage division ratio designed to change depending on temperature, and is connected between a source and a drain of said MOSFET, a sensing circuit for taking out the source-to-drain voltage divided with the voltage divider to sense the current flowing through the MOSFET, wherein when an on-resistance value of the MOSFET is denoted by Ron, a resistance value of the first resistor by R1, and a resistance value of the second resistor by R2, a value of expression Ron*R2/(R1+R2) either falls within 5% for a temperature range of not more than 50° C. or falls within 25% for a temperature range of above 50° C. to 200° C.

* * * * *